US009229313B2

(12) United States Patent
Takagi et al.

(10) Patent No.: US 9,229,313 B2
(45) Date of Patent: Jan. 5, 2016

(54) EXPOSURE APPARATUS AND DEVICE MANUFACTURING METHOD

(75) Inventors: Atsushi Takagi, Utsunomiya (JP); Yoya Muraguchi, Saitama (JP); Tomomi Funayoshi, Utsunomiya (JP)

(73) Assignee: CANON KABUSHIKI KAISHA (JP)

(*) Notice: Subject to any disclaimer, the term of this patent is extended or adjusted under 35 U.S.C. 154(b) by 1126 days.

(21) Appl. No.: 12/908,377

(22) Filed: Oct. 20, 2010

(65) Prior Publication Data

US 2011/0102754 A1    May 5, 2011

(30) Foreign Application Priority Data

Oct. 29, 2009    (JP) .................................. 2009-249476

(51) Int. Cl.
*G03B 27/42* (2006.01)
*G03F 9/00* (2006.01)
*G03F 7/20* (2006.01)

(52) U.S. Cl.
CPC ............ *G03B 27/42* (2013.01); *G03F 7/70933* (2013.01); *G03F 9/7088* (2013.01); *G03F 9/7096* (2013.01)

(58) Field of Classification Search
CPC ... G03B 27/42; G03F 7/70933; G03F 9/7096; G03F 7/70608; G03F 9/7084; G03F 9/7088
USPC .................................... 355/30, 53, 55, 67, 77
See application file for complete search history.

(56) References Cited

U.S. PATENT DOCUMENTS

| 5,025,284 A * | 6/1991 | Komoriya et al. ............... 355/53 |
| 5,973,766 A * | 10/1999 | Matsuura et al. ............... 355/52 |
| 2006/0077388 A1* | 4/2006 | Koga ............................. 356/401 |
| 2006/0146300 A1* | 7/2006 | Simon et al. .................... 355/30 |
| 2007/0279606 A1* | 12/2007 | Nagasaka ....................... 355/40 |

FOREIGN PATENT DOCUMENTS

JP    01-195445 A    8/1989

* cited by examiner

*Primary Examiner* — Toan Ton
*Assistant Examiner* — Mona M Sanei
(74) *Attorney, Agent, or Firm* — Rossi, Kimms & McDowell LLP

(57) ABSTRACT

An exposure apparatus includes an atmosphere maintaining unit which maintains an exposure chamber in an air atmosphere, a gas supply unit which supplies air or a mixed gas containing air and an inert gas to a local space, between a final surface of a projection optical system and a substrate, a detector which detects an alignment mark and a reference mark formed on the substrate stage, and a controller. The controller controls the gas supply unit not to supply the mixed gas to the local space when the detector detects the reference mark, and controls the gas supply unit to supply the mixed gas to the local space when an instruction to detect the alignment mark upon setting the local space in a mixed gas atmosphere, and expose the substrate based on the detection results of the reference mark and the alignment mark is issued from the recipe.

12 Claims, 2 Drawing Sheets

EXPOSURE APPARATUS AND DEVICE MANUFACTURING METHOD

BACKGROUND OF THE INVENTION

1. Field of the Invention

The present invention relates to an exposure apparatus and a method of manufacturing a device such as a color filter or a liquid crystal display device using the exposure apparatus.

2. Description of the Related Art

A variety of methods of manufacturing color filters have been developed, and include, for example, staining methods, printing methods, electrodeposition and electrolytic methods, and pigment dispersing methods. Among such methods, the pigment dispersing methods are the current mainstream from the viewpoint that they are stable and easy manufacture. A method of using a photosensitive acrylic polymer as a typical pigment dispersing method forms a pattern on a color resist, which contains an acryloid photosensitive resin and has both a coloring function and a photosensitizing function, using a photolithography technique. This color resist is a negative resist, and produces radicals, which contribute to a polymerization reaction, upon being irradiated with light for use in exposure, forms polymers by photopolymerization, and becomes insoluble in a developer. However, this color resist is hindered from bringing about the polymerization reaction because its pigment components easily absorb the exposure light, and the radicals produced by it are trapped by oxygen in the air. Hence, to obtain a desired pattern shape, exposure light with a higher energy must be used. To avoid this, a known method provides an oxygen barrier film, which is made of polyvinyl alcohol and blocks off oxygen, on the resist. However, this method may generate defects because the oxygen barrier film has poor wettability on the resist, and requires a higher cost related to an additional process of coating a resist with an oxygen barrier film. Furthermore, in the method of providing an oxygen barrier film, the oxygen concentration cannot be controlled, and this lowers the flexibility for finer pattern shape/dimensional precision control in forming a fine pattern.

To solve these problems of the method of providing an oxygen barrier film, Japanese Patent Laid-Open No. 1-195445, for example, proposes a method of exposing a resist film under a low-oxygen concentration condition by blowing nitrogen gas onto it without providing a polyvinyl alcohol film on it.

In a step which requires exposure under a low-oxygen concentration condition to decrease the exposure dose in a process of manufacturing, for example, a color filter, it is a common practice to expose a resist by blowing an inert gas such as nitrogen onto the resist. However, a performance problem is posed when the inert gas is always blown onto the resist to purge it. In a step which does not require any inert gas, a target pattern shape and line width cannot be attained upon exposing the resist in an inert gas environment. A desired oxygen concentration in exposure differs even among individual color resists such as a blur resist, a green resist, and a red resist. Especially detection of a reference mark for calibration requires high precision, but the reference mark is normally positioned on the edge of a substrate stage. Therefore, when the reference mark is detected while flowing an inert gas onto the resist, a detection error occurs in response to a change in refractive index due to factors associated with the inert gas.

SUMMARY OF THE INVENTION

The present invention provides an exposure apparatus which attains a target pattern shape and line width by reducing an alignment error or a focus error.

According to one aspect of the present invention, there is provided an exposure apparatus which is disposed in an exposure chamber, and exposes a resist, formed on a substrate, via a projection optical system in accordance with a recipe, the apparatus comprising a substrate stage which can move while holding the substrate; an atmosphere maintaining unit which maintains a space in the exposure chamber in an air atmosphere; a gas supply unit which supplies one of air and a mixed gas containing air and an inert gas to a local space, between a final surface of the projection optical system and the substrate held by the substrate stage, of the space; a detector which detects a position of an alignment mark, formed on the substrate, and a position of a reference mark, formed on the substrate stage; and a controller, wherein the controller controls the gas supply unit not to supply the mixed gas to the local space when the detector detects the position of the reference mark, and controls the gas supply unit to supply the mixed gas to the local space when an instruction to detect the position of the alignment mark upon setting the local space in a mixed gas atmosphere, and expose the resist while driving the substrate stage based on the detection result of the position of the reference mark and the detection result of the position of the alignment mark is issued from the recipe.

Further features of the present invention will become apparent from the following description of exemplary embodiments with reference to the attached drawings.

DESCRIPTION OF THE EMBODIMENTS

Exposure Apparatus

Figure 1:
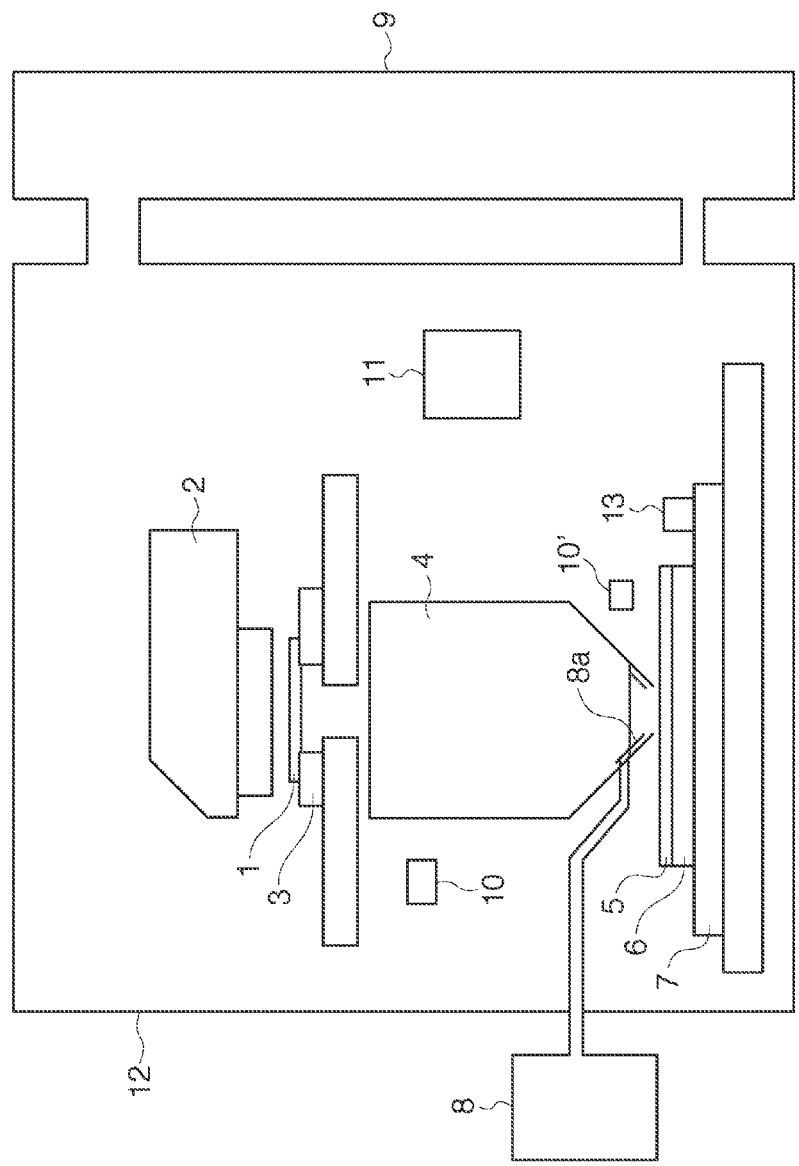
FIG. 1 is a view showing the arrangement of an exposure apparatus according to the present invention.

FIG. 1 is a view showing the arrangement of an exposure apparatus, which exposes a resist 5 while driving a substrate stage 7 in accordance with a recipe, according to the present invention. Light emitted by a light source such as a mercury lamp, an ArF excimer laser, or a KrF excimer laser passes through an illumination system 2, and irradiates a reticle 1, thereby transferring the pattern on the reticle 1 onto the resist 5, formed on a substrate 6, via a projection optical system 4. The reticle 1 is movably held by a reticle stage 3, and the substrate 6 is movably held by the substrate stage 7. A reference mark 13 for calibration is formed on the edge of the substrate stage 7. The exposure apparatus is disposed in an exposure chamber 12, and the space in the exposure chamber 12 is maintained in an air atmosphere whose temperature and humidity are controlled by an atmosphere maintaining unit 9. Air or a mixed gas containing air and an inert gas is supplied from a gas supply unit 8 to a local space between the substrate 6 and the final surface of the projection optical system 4 via a gas supply nozzle. An example of the inert gas is nitrogen gas. The gas supply unit 8 may be able to individually store a plurality of types of mixed gases which have different composition ratios between the inert gas and the air and different oxygen concentrations in them, and change the oxygen concentration in the local space purged by the mixed gas. The local space purged by the gas supplied by the gas supply unit 8 may be a space closed to some extent using, for example, an enclosure to efficiently lower the oxygen concentration by preventing the mixed gas from diffusing in exposing the resist 5. The position of the reference mark 13 and those of alignment marks (not shown) formed in a plurality of shots, respectively, on the substrate 6 are detected by a first detector 10 of the off-axis type. In calibration, the position of the reference mark 13 is detected by each of a TTL (Through The Lens) detector and the first detector 10, and the relative positional relationship between these two detectors is stored. The positions of the substrate 6 and reference mark 13 in the optical axis direction of the projection optical system 4 are detected by a second detector 10' of the oblique incidence scheme. In calibration, the position of the reference mark 13 in the optical axis direction is detected by each of a TTL (Through The Lens) detector and the second detector 10', and the relative positional relationship between these two detectors is stored. The exposure apparatus includes a built-in controller 11 which controls an exposure process including supply of a purge gas by the gas supply unit 8.

Figure 2:
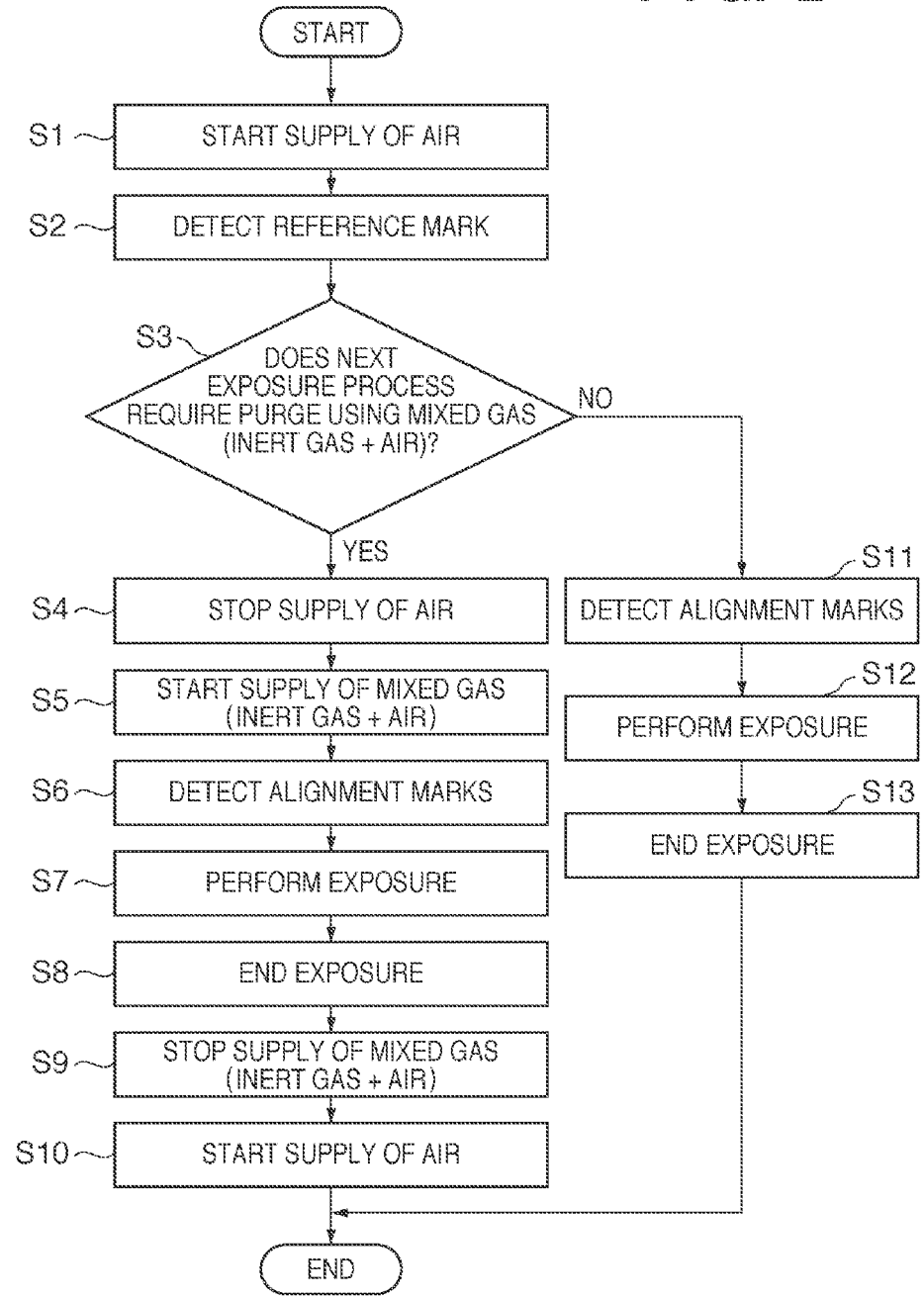
FIG. 2 is a flowchart showing the sequence of an exposure method according to the present invention.

An exposure process which uses the exposure apparatus with the foregoing arrangement will be described with reference to a flowchart shown in FIG. 2. In step S1, the atmosphere of the space in the exposure chamber 12 is adjusted to an air atmosphere, including a local space (to be referred to as a purge space hereinafter) between the substrate stage 7 and the final surface of the projection optical system 4. For example, supply of a purge gas by the gas supply unit 8 is stopped. In this case, the entire space in the exposure chamber 12 is maintained in an air atmosphere by the atmosphere maintaining unit 9, so the atmosphere of the purge space is adjusted to an air atmosphere. If the inert gas remains in the purge space, dry air may be supplied to the purge space by the gas supply unit 8 to quickly adjust the atmosphere of the purge space to an air atmosphere by replacing the residual inert gas with air. When no exposure process is performed, the purge space is maintained in an air atmosphere to prevent lenses which constitute the projection optical system 4 from fogging.

In step S2, calibration is performed. The reference mark 13 for calibration is formed on the edge of the substrate stage 7, and tends to disturb the flow of the purge gas around it. If the purge gas is a mixed gas containing an inert gas and air, the type of ambient gas differs between the purge space and its outside. In a portion of the purge space, which is near the reference mark 13, the flow of the purge gas is likely to be disturbed, and the refractive index of the atmosphere of the purge space is therefore likely to fluctuate. Thus, an error often occurs in the detection result obtained by the first detector 10 due to the fluctuation in refractive index in that portion, so calibration is performed in an air atmosphere. The exposure apparatus is normally calibrated for the first substrate 6 in a lot, and the obtained calibration result is used for the second and subsequent substrates 6.

In step S3, the controller 11 determines whether a recipe which specifies the procedure of exposure processes indicates that the next exposure process requires a purge using a mixed gas containing an inert gas. Exposure conditions are set for each exposure process in the recipe, and an indication that an exposure process requires a purge using a mixed gas containing an inert gas is described in a purge condition check box for this exposure process. Also, the oxygen concentration in the atmosphere of the purge space differs for each exposure process, so a desired oxygen concentration is calculated in advance by an experiment and is also described in the recipe for this exposure process. If, for example, a resist 5 to be exposed is selected from a plurality of color resists, the oxygen concentration in exposure differs among a blue resist, a green resist, and a red resist. To generate mixed gasses with different oxygen concentrations by changing the amount of supply of an inert gas and air, the relationship between the oxygen concentration in the mixed gas and the supply conditions of an inert gas and dry air is calculated in advance, and stored in the controller 11 in the form of a table. The controller 11 also determines based on the recipe whether supply of a mixed gas containing an inert gas is necessary, and reads the supply conditions of an inert gas and air based on the oxygen concentration set in the recipe, and the table which describes the relationship between the oxygen concentration and the supply conditions and stored in advance. If no purge using a mixed gas is necessary, the process advances to step S11; otherwise, the process advances to step S4, in which the sequence continues. If a purge using dry air has been performed until then, the controller 11 stops the supply of dry air by the gas supply unit 8 in step S4.

In step S5, the controller 11 starts supply of a mixed gas containing an inert gas and dry air from the gas supply unit 8 under the supply conditions read in step S3. Since a desired exposure performance cannot be achieved until the atmosphere of the purge space reaches an effective oxygen concentration, an oxymeter is provided in the purge space, and the process stands by until a specific oxygen concentration is reached or for a standby time calculated in advance by an experiment. When the atmosphere of the purge space has reached a predetermined oxygen concentration, in step S6 the first detector 10 detects the positions of alignment marks formed in a plurality of shots, respectively. The controller 11 has, in advance, information indicating a change in output from the first detector 10 due to the difference in refractive index of the atmosphere of the purge space between a case in which an air atmosphere is formed in the purge space and that in which a mixed gas atmosphere is formed in this space. Since the refractive index changes depending on the temperature, the atmospheric pressure, and the humidity, they are obtained using sensors, the refractive index is calculated using an appropriate conversion equation, and thereupon the above-mentioned information indicating a change in output from the first detector 10 is calculated.

In step S7, the controller 11 corrects, using the above-mentioned information, the detection results of the positions of the alignment marks, which are obtained under the condition in which a mixed gas atmosphere is formed in the purge space, to numerical values under the condition in which an air atmosphere is formed in the purge space. The controller 11 controls the position of the substrate stage 7 in exposing the resist 5, based on the corrected results and the position of the reference mark 13 detected by the first detector 10 in step S2. After the controller 11 confirms that the alignment mark detection in step S6 and the exposure processes in step S7 are complete for all substrates 6 belonging to the lot, in step S9 it stops the supply of a mixed gas containing an inert gas and dry air from the gas supply unit 8 to the purge space. The controller 11 removes any inert gas present in the purge space, and starts supply of dry air from the gas supply unit 8 in step S10 to prevent lenses which constitute the projection optical system 4 from fogging.

If the controller 11 determines in step S3 that the next exposure process does not require any purge using a mixed gas, the process advances to step S11. An example of an exposure process which does not require any purge using a mixed gas is an exposure process for a resist 5 which contains no acryloid photosensitive resin. Steps S11 to S13 are the same as steps S6 to S8, respectively, except that the purge gas is dry air in the former and a mixed gas in the latter.

As has been described above, the atmosphere of the purge space is changed between the time when the reference mark 13 is detected and that when the alignment marks are detected and exposure is performed. However, the same situation as when the alignment marks are detected also occurs when the level positions (focuses) of the substrate 6 and reference mark 13 in the optical axis direction of the projection optical system 4 are detected. That is, in detecting the focus of the reference mark 13, the flow of the purge gas is likely to be disturbed in a portion of the purge space, which is near the reference mark 13, and the refractive index of the atmosphere of the purge space is therefore likely to fluctuate in that portion, so the purge space is maintained in an air atmosphere. In contrast, focus detection within the plane of the substrate 6 to calculate the overall tilt of the substrate 6 and obtain a focus offset due to pattern underlying factors, and look-ahead focus detection of the substrate 6 in exposure are performed while the purge space is in the atmosphere of a mixed gas containing air and an inert gas. Hence, a change in detection result due to the difference in refractive index of the atmosphere of the purge space depending on the difference in type of ambient gas in the purge space must be corrected in the focus detection as well as the alignment detection.

Method of Manufacturing Device

A method of manufacturing a device using the above-mentioned exposure apparatus will be described next. In this case, a device is manufactured by a step of exposing a resist 5, formed on a substrate 6, using the above-mentioned exposure apparatus, a step of developing the exposed resist 5, and subsequent known steps. The device can be, for example, a semiconductor integrated circuit device or a liquid crystal display device. The substrate 6 can be, for example, a wafer or a glass plate. The known steps include, for example, oxidation, film formation, vapor deposition, doping, planarization, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-249476, filed Oct. 29, 2009, which is hereby incorporated by reference herein in its entirety.

What is claimed is:

1. An exposure apparatus which exposes a resist, formed on a substrate, via a projection optical system in accordance with a recipe which specifies oxygen concentration, the apparatus comprising:
a substrate stage which is configured to move while holding the substrate;
a gas supply unit which supplies one of air and a mixed gas containing air and an inert gas to a local space, between a final surface of the projection optical system and the substrate held by said substrate stage, of the space;
a detector which detects a position of an alignment mark, formed on the substrate, and a position of a reference mark, formed on said substrate stage; and
a controller configured to determine whether a next exposure process requires a purge using the mixed gas containing air and an inert gas, and to control the atmosphere of the local space based on the determination, by supplying either the air or the mixed gas containing air and an inert gas in accordance with the recipe to control oxygen concentration in the local space,
wherein the controller receives input from the detector and adjusts atmosphere of the local space between a time when the reference mark is detected and a time when exposure is performed.

2. The apparatus according to claim 1, wherein said controller
has information indicating a change in output from said detector due to a difference in refractive index of an atmosphere of the local space between a case in which an air atmosphere is formed in the local space and a case in which the mixed gas atmosphere is formed in the local space, and
corrects, using the information, the detection result of the position of the alignment mark, which is obtained by said detector under a condition in which the mixed gas atmosphere is formed in the local space, to a numerical value when the air atmosphere is formed in the local space, and
controls a position of said substrate stage based on the corrected result and the detection result of the position of the reference mark, which is obtained by said detector, in exposing the resist.

3. An exposure apparatus which exposes a resist, formed on a substrate, via a projection optical system in accordance with a recipe which specifies oxygen concentration, the apparatus comprising:
a substrate stage which is configured to move while holding the substrate;
a gas supply unit which supplies one of air and a mixed gas containing air and an inert gas to a local space, between a final surface of the projection optical system and the substrate held by said substrate stage, of the space;
a detector which detects a position of the substrate in an optical axis direction of the projection optical system, and a position, in the optical axis direction, of a reference mark formed on said substrate stage; and
a controller configured to determine whether a next exposure process requires a purge using the mixed gas containing air and an inert gas, and to control the atmosphere of the local space based on the determination, by supplying either the air or the mixed gas containing air and an inert gas in accordance with the recipe to control oxygen concentration in the local space,
wherein the controller receives input from the detector and adjusts atmosphere of the local space between a time when the reference mark is detected and a time when exposure is performed.

4. The apparatus according to claim 3, wherein said controller
has information indicating a change in output from said detector due to a difference in refractive index of an atmosphere of the local space between a case in which an air atmosphere is formed in the local space and a case in which the mixed gas atmosphere is formed in the local space, and
corrects, using the information, the detection result of the position of the substrate in the optical axis direction, which is obtained by said detector under a condition in which the mixed gas atmosphere is formed in the local space, to a numerical value when the air atmosphere is formed in the local space, and
controls a position of said substrate stage based on the corrected result and the detection result of the position of the reference mark in the optical axis direction, which is obtained by said detector, in exposing the resist.

5. The apparatus according to claim 1, further comprising a through-the-lens detector,
wherein said controller controls said gas supply unit not to supply the mixed gas to the local space when said through-the-lens detector detects a position of the reference mark, and calculates a relative positional relationship between said detector and said through-the-lens detector using the positions of the reference mark, which are detected by said detector and said through-the-lens detector, respectively, without supplying the mixed gas to the local space.

6. The apparatus according to claim 3, further comprising a through-the-lens detector,
wherein said controller controls said gas supply unit not to supply the mixed gas to the local space when said through-the-lens detector detects a position of the reference mark in the optical axis direction, and calculates a relative positional relationship between said detector and said through-the-lens detector using the positions of the reference mark in the optical axis direction, which are detected by said detector and said through-the-lens detector, respectively, without supplying the mixed gas to the local space.

7. The apparatus according to claim 1, wherein
the resist is selected from a plurality of color resists, and
said controller controls said gas supply unit to adjust an oxygen concentration in an atmosphere of the local space to an oxygen concentration corresponding to the selected color resist.

8. The apparatus according to claim 3, wherein
the resist is selected from a plurality of color resists, and
said controller controls said gas supply unit to adjust an oxygen concentration in an atmosphere of the local space to an oxygen concentration corresponding to the selected color resist.

9. A method of manufacturing a device, the method comprising:
exposing a resist, formed on a substrate, via a projection optical system in accordance with a recipe which specifies oxygen concentration using an exposure apparatus;
developing the exposed resist; and
processing the substrate, on which the resist is developed, to manufacture the device,
wherein the exposure apparatus comprises
a substrate stage which is configured to move while holding the substrate,
a gas supply unit which supplies one of air and a mixed gas containing air and an inert gas to a local space, between a final surface of a projection optical system and the substrate held by the substrate stage, of the space,
a detector which detects a position of an alignment mark, formed on the substrate, and a position of a reference mark, formed on the substrate stage, and
a controller configured to determine whether a next exposure process requires a purge using the mixed gas containing air and an inert gas, and to control the atmosphere of the local space based on the determination, by supplying either the air or the mixed gas containing air and an inert gas in accordance with the recipe to control oxygen concentration in the local space,
wherein the controller receives input from the detector and adjusts atmosphere of the local space between a time when the reference mark is detected and a time when exposure is performed.

10. A method of manufacturing a device, the method comprising:
exposing a resist, formed on a substrate, via a projection optical system in accordance with a recipe which specifies oxygen concentration using an exposure apparatus;
developing the exposed resist; and
processing the substrate, on which the resist is developed, to manufacture the device,
wherein the exposure apparatus comprises
a substrate stage which is configured to move while holding the substrate,
a gas supply unit which supplies one of air and a mixed gas containing air and an inert gas to a local space, between a final surface of a projection optical system and the substrate held by the substrate stage, of the space,
a detector which detects a position of the substrate in an optical axis direction of the projection optical system, and a position, in the optical axis direction, of a reference mark formed on the substrate stage, and
a controller configured to determine whether a next exposure process requires a purge using the mixed gas containing air and an inert gas, and to control the atmosphere of the local space based on the determination, by supplying either the air or the mixed gas containing air and an inert gas in accordance with the recipe to control oxygen concentration in the local space,
wherein the controller receives input from the detector and adjusts atmosphere of the local space between a time when the reference mark is detected and a time when exposure is performed.

11. An exposure apparatus which exposes a resist, formed on a substrate, via a projection optical system in accordance with a recipe which specifies oxygen concentration, the apparatus comprising:
a substrate stage which is configured to move while holding the substrate;
a gas supply unit which supplies a mixed gas containing air and an inert gas to a local space, between a final surface of the projection optical system and the substrate held by said substrate stage, of the space;
a detector which detects a position of an alignment mark, formed on the substrate, and a position of a reference mark, formed on said substrate stage; and
a controller configured to determine whether a next exposure process requires a purge using the mixed gas containing air and an inert gas, and to control the atmosphere of the local space based on the determination, by supplying either the air or the mixed gas containing air and an inert gas in accordance with the recipe to control oxygen concentration in the local space,
wherein the controller receives input from the detector and adjusts atmosphere of the local space between a time when the reference mark is detected and a time when exposure is performed.

12. An exposure apparatus which exposes a resist, formed on a substrate, via a projection optical system in accordance with a recipe which specifies oxygen concentration, the apparatus comprising:
a substrate stage which is configured to move while holding the substrate;
a gas supply unit which supplies a mixed gas containing air and an inert gas to a local space, between a final surface of the projection optical system and the substrate held by said substrate stage, of the space;
a detector which detects a position of the substrate in an optical axis direction of the projection optical system, and a position, in the optical axis direction, of a reference mark formed on said substrate stage; and
a controller configured to determine whether a next exposure process requires a purge using the mixed gas containing air and an inert gas, and to control the atmosphere of the local space based on the determination, by supplying either the air or the mixed gas containing air and an inert gas in accordance with the recipe to control oxygen concentration in the local space, wherein the controller receives input from the detector and adjusts atmosphere of the local space between a time when the reference mark is detected and a time when exposure is performed.

* * * * *